(12) United States Patent
Kanamori

(10) Patent No.: US 6,339,242 B2
(45) Date of Patent: Jan. 15, 2002

(54) SEMICONDUCTOR DEVICE LACKING STEEPLY RISING STRUCTURES AND FABRICATION METHOD OF THE SAME

(75) Inventor: Kohji Kanamori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/730,312

(22) Filed: Dec. 5, 2000

(30) Foreign Application Priority Data

Dec. 22, 1999 (JP) .......................................... 11-364871

(51) Int. Cl.[7] .............................................. H01L 29/72
(52) U.S. Cl. ........................ 257/315; 257/316; 257/333
(58) Field of Search ................................ 257/315, 316, 257/333

(56) References Cited

U.S. PATENT DOCUMENTS 6,069,382 A1 * 3/2001 Libera et al. ............... 257/326

FOREIGN PATENT DOCUMENTS

JP          2960082         7/1999

* cited by examiner

Primary Examiner—Edward Wojciechowicz
(74) Attorney, Agent, or Firm—Hutchins, Wheeler & Dittmar

(57) ABSTRACT

A semiconductor device has a construction in which a gate dielectric film is formed on the surface of a semiconductor substrate having source regions and drain regions, a plurality of FG (Floating Gates) are formed on the gate dielectric film, an intergate dielectric film is formed on the FG, and CG (Control Gates) are formed on the intergate dielectric film. Mounds are formed on both sides of the FG. An interlayer dielectric film is formed between the gate dielectric film and the intergate dielectric film and covering these mounds. The FG are constituted by upper FG and lower FG, and the upper FG are formed to spread toward the areas where the mounds are formed and cover a portion of the interlayer dielectric film. The gate dielectric film is formed in a shape that does not rise in a direction that is substantially perpendicular to the surface of the semiconductor substrate at least above the upper FG.

13 Claims, 9 Drawing Sheets

SEMICONDUCTOR DEVICE LACKING STEEPLY RISING STRUCTURES AND FABRICATION METHOD OF THE SAME

BACKGROUND OF THE INVENTION

1. Field of the Invention

The present invention relates to a semiconductor device such as a nonvolatile memory in which a plurality of transistor elements are arranged, and to a method of fabricating such a device.

2. Description of the Related Art

Semiconductor devices of various configurations are currently in practical use, and in nonvolatile memory such as flash memory, EPROM, and EEPROM, transistor elements having floating gates (hereinbelow abbreviated as "FG") are arranged in a two-dimensional form as memory cells. In this case, the FG of the transistor elements hold injected electrons, by which nonvolatile storage of binary data or multivalue data is realized.

This type of nonvolatile memory also has various modes, with the FN (Fowler-Nordheim) tunneling mode and CHE (Channel Hot Electron) mode as modes of writing/erasing. When erasing stored data in the AND flash memory of the FN tunneling mode, for example, electrons are drawn out from the FG of transistor elements, which are the memory cells; a voltage of −20 (V) is therefore applied to the control gate (hereinbelow abbreviated as "CG") that confronts the FG, with the substrate as 0 (V). Thus, making the confronting areas of FG and CG greater than the confronting areas of the FG and channel and increasing the capacitance enables a reduction of the voltage that must be applied to CG to inject prescribed electrons to the FG.

A semiconductor device in which the confronting areas of the FG and CG of transistor elements are increased is disclosed in "A 0.24-um$^2$ Cell Process with 0.18-um Width Isolation and 3-D Interpoly Dielectric Films for 1-Gb Flash Memories" (IEEE Tech. Dig. IEDM (1997) pp. 275).

Referring now to FIGS. 1a and 1b, a simple explanation is next presented regarding the semiconductor device described in the above publication. FIG. 1a is a vertical sectional view in which the semiconductor device is cut at the position of a transistor element, and FIG. 1b is a vertical section in which a semiconductor device is cut at a position between transistor elements.

In the interest of simplifying the explanation, the vertical (up-down) and horizontal (right-left) directions are defined in accordance with the figures. Nonvolatile memory 100 that is here taken as an example is provided with semiconductor substrate 101. A plurality of transistor elements 110 are arranged as memory cells on semiconductor substrate 101 in a matrix form in the horizontal direction of the figure and in the direction of depth of the figure.

Transistor elements 110 are separated in the horizontal direction at element separators 102, element separators 102 having their lower portions buried in the surface of semiconductor substrate 101 and their upper portions protruding from the surface of semiconductor substrate 101. Source regions 111 and drain regions 112 are formed below the level of the surface of semiconductor substrate 101 at the positions of the transistor elements 110 that are separated by element separators 102, and gate dielectric film 113 is formed on the surface of semiconductor substrate 101.

Lower FG 114 are formed on the surface of this gate dielectric film 113 at positions between source regions 111 and drain regions 112, and upper FG 115 are formed on the surface of lower FG 114. Source regions 111 and drain regions 112 are formed in the direction of depth of the figure, but lower FG 114 and upper FG 115 are divided into a plurality of sections in the direction of depth of the figure, thereby realizing a configuration in which a plurality of transistor elements 110 are arranged in the direction of depth of the figure.

Interlayer dielectric film 103 is formed between element separators 102 and each of FG 114 and 115. Upper FG 115 are formed to spread over the surface of interlayer dielectric film 103 with the area of the upper surface of upper FG 115 being greater than the area of lower FG 114. CG 117 is formed across the horizontal direction of the figure on the upper surface of these upper FG 115, with ONO (Oxide-Nitride-Oxide) film 116, which is an intergate dielectric film, interposed.

The upper surface of this CG 117 and the uppermost surface of the above-described configuration formed on semiconductor substrate 101 are protected by isolation layer 104. In this nonvolatile memory 100, CG 117 function as word lines and drain regions 112 function as bit lines.

In nonvolatile memory 100 of the above-described configuration, each of a multiplicity of transistor elements 110 arranged in matrix form can store individual bits of data as a memory cell, and moreover, can erase the stored data for prescribed units of a plurality of transistor elements 110.

In a case in which one part of binary data is written to a particular transistor element 110, electrons are injected to FG 114 and 115 by applying 0 V to source region 111, 0 V to drain region 112, and a voltage of 18 V to CG 117.

In transistor element 110 in which data are not written at this time, either a voltage of 0 V is applied to CG 117, or a voltage of 5 V is applied to drain region 112 and source region 111 is made open, whereby the electric field that works on gate dielectric film 113 remains weak and electrons are not injected in FG 114 and 115.

In a transistor element 110 in which electrons are not injected into these FG 114 and 115, the cell threshold value is kept at a prescribed erase level, and stored data are therefore maintained at a default value of "0." In transistor element 110 in which electrons are injected to FG 114 and 115, on the other hand, the cell threshold value becomes a prescribed write level, whereby, for example, the data "1" are stored.

In above-described nonvolatile memory 100, the FG is of a two-layered construction of lower FG 114 and upper FG 115, and CG 117 confronts upper FG 115 without confronting lower FG 114. Since the upper surface of this upper FG 115 both extends horizontally and is formed with a concave center, CG 117 confronts upper FG 115 over a large surface area. The capacitance between CG 117 and upper FG 115 is therefore great, thus reducing the voltage that must be applied to CG 117 to control the electrons of FG 114 and 115.

Next, regarding one example of a method of fabricating nonvolatile memory 100 having the above-described configuration, a gate dielectric film and a lower polysilicon film are first grown in that order on the upper surface of semiconductor substrate 101. Gate dielectric film 113 and lower FG 114 are next formed by removing portions of lower polysilicon film and gate dielectric film so as to divide the lower polysilicon film into a plurality of sections in the horizontal direction.

Source region 111 and drain region 112 are next formed by ion-injecting impurities into semiconductor substrate 101, and interlayer dielectric film 103 is grown on the surfaces of this semiconductor substrate 101 and lower FG 114. A trench is formed and insulating material embedded at the position of element isolator 102 of this interlayer dielectric film 103, and the upper surface of interlayer dielectric film 103 is leveled by CMP (Chemical Mechanical Polishing).

Next, after forming a trench in the surface of lower FG 114, an upper polysilicon film is formed, and upper FG 115 are formed by removing portions of the upper polysilicon film so as to divide this upper polysilicon film into a plurality of sections. ONO film 116 is then formed on the surface of this upper FG 115, and an upper conductive film is grown from polysilicon film or tungsten silicide on this surface.

For the purpose of dividing transistor element 110 in the direction of depth of the figure, a photoresist is first applied to the surface of the upper conductive film, a resist mask is formed by patterning this photoresist, and CG 117 is formed by etching the upper conductive film using this resist mask as shown in FIG. 1a.

Next, the etching gas is altered with the resist mask left in the regions between transistor elements 110 in the direction of depth of the figure, and ONO film 116 is then subjected to anisotropic etching, following which the etching gas is again altered, and transistor elements 110 are separated in the direction of depth of the figure by etching both upper FG 115 and lower FG 114.

In nonvolatile memory 100 as described in the foregoing explanation, CG 117 and upper FG 115 have a high capacitance because the confronting areas of upper FG 115 and CG 117 are large, thereby allowing a reduction in the voltage that is applied when writing data. However, difficulties can be expected when fabricating nonvolatile memory 100 of the above-described configuration.

Specifically, in actual nonvolatile memory 100, FG 114 and 115, ONO film 116, and CG 117 must be divided in the direction of depth in order to arrange a plurality of transistor elements 110 in the direction of depth of the figure. Although this can be accomplished by anisotropic plasma etching from above as described hereinabove, ONO film 116 will remain on the side walls of upper FG 115 as shown in FIG. 2a when the surface of upper FG 115 is formed as a depression.

Thus, when the remaining ONO film 116 is completely removed by anisotropic plasma etching from above, etching of ONO film 116 in the horizontal direction will be excessive, with etching proceeding as far as upper FG 115.

Since overetching to completely eliminate the remaining ONO film 116 is therefore not possible, ONO film 116 is under-etched. As a result, portions of FG 114 and 115 remain as shown in FIG. 2b and FIG. 3, and adjacent transistor elements 110 in the direction of depth will short circuit with each other.

In such cases, a write voltage or erase voltage to a particular transistor element 110 will affect adjacent transistor elements 110 and thus cause malfunctions in which erroneous data are written to transistor elements 110 that cannot be predicted or in which written data are erased.

One possible method of solving this problem involves carrying out plasma etching until portions of ONO film 116 that are attached in the vertical direction are eliminated, but this method results in excessive etching in which areas not requiring etching are etched.

SUMMARY OF THE INVENTION

It is an object of the present invention to provide a semiconductor device that can be easily fabricated wherein the FG of transistor elements that are arranged in matrix form are provided in two layers and the area that confronts CG is increased, as well as a method of fabricating such a semiconductor device.

The semiconductor device of the present invention has a configuration in which a gate dielectric film is formed on the surface of a semiconductor substrate having source regions and drain regions, a plurality of FG are formed on the gate dielectric film, a plurality of intergate dielectric films are formed on the FG, and a plurality CG are formed on the intergate dielectric films. Mounds are formed on both sides of FG. Interlayer dielectric films are formed between the gate dielectric films and intergate dielectric films and covering these mounds. The FG are constituted by upper FG and lower FG, the upper FG being formed to spread toward the areas in which the mounds are formed and cover a portion of the interlayer dielectric film. The gate dielectric film is formed in a shape that does not rise in a direction that is substantially perpendicular to the surface of the semiconductor substrate at least above the upper FG.

The source regions and drain regions are formed to extend in one direction along the surface of the semiconductor substrate. The plurality of FG are arranged in the direction in which the source regions and drain regions extend, whereby a plurality of transistor elements are arranged in the direction in which the source regions and drain regions extend between the portions in which the source regions are formed and the portions in which the drain regions are formed.

By configuring the semiconductor device as described above, the area of the upper surfaces of the upper FG, i.e., the area that confronts CG, is greater than the area of the upper surfaces of the lower FG. The capacitance between the CG and upper FG is therefore increased, and the voltage that is applied to CG for controlling the electrons of the FG can be reduced.

The semiconductor device of the above-described invention has a configuration in which a plurality of transistor elements are arranged in the direction in which the source regions and drain regions extend. When forming such a construction, a method is adopted in which upper FG, intergate dielectric films, and CG are formed on the lower FG in the direction in which the source regions and drain regions extend, following which these components are subjected to partial etching to divide into a plurality of sections in the direction in which the source regions and drain regions are formed. Here, the intergate dielectric film is formed in a shape that does not rise in a direction that is substantially perpendicular to the surface of the semiconductor substrate at least above the upper FG, and as a result, no intergate dielectric film is left by etching.

According to a preferable embodiment of the semiconductor device of the present invention, in order to form the intergate dielectric film in the above-described shape, the surfaces of the upper FG are formed in a shape having no portions that are substantially perpendicular to the surface of the semiconductor substrate. Furthermore, according to a preferable embodiment of the semiconductor device of the present invention, in order to form the surface of the upper FG in the above-described shape, the surface of the interlayer dielectric film is formed in a shape having no portions that are substantially perpendicular to the surface of the semiconductor substrate.

In addition, according to a preferable embodiment of the semiconductor device of the present invention, a plurality of the above-described transistor elements are also arranged in a direction that is perpendicular to the direction in which the source regions and drain regions extend. In this case, the mounds that are formed at both sides of the lower FG also function as element isolation electrodes that insulate transistor elements that are adjacent in the direction that is perpendicular to the direction in which the source regions and drain regions extend. In this case, moreover, the element isolation electrodes are preferably formed from the same material as the lower FG. Element isolation transistors are thus formed from the element isolation electrodes, drain regions, and source regions. In this case, moreover, the element isolation electrodes and semiconductor substrate may be grounded. Since the element isolation transistors are kept in an OFF state, transistor elements that are adjacent in the direction that is perpendicular to the direction in which the source regions and drain regions extend are insulated.

The method of fabricating the semiconductor device of this invention is a method of fabricating a semiconductor device having a configuration in which a plurality of transistor elements are arranged along the direction in which the source regions and drain regions extend, this method having as its most characteristic step a step for forming the interlayer dielectric film, upon which the upper conductive layer that constitutes the upper FG of the transistor elements is formed, in a shape in which the surface of the interlayer dielectric film is not substantially perpendicular to the surface of the semiconductor substrate at both sides of a lower conductive layer that constitutes the lower FG of the transistor elements.

Thus, despite forming an upper conductive layer on the interlayer dielectric film, and further, despite forming an intergate dielectric film on this upper conductive layer, the surface of the intergate dielectric film is also formed in a shape having no portions that are substantially perpendicular to the surface of the semiconductor substrate in regions in which the transistor elements of the semiconductor substrate are formed. Accordingly, upper conductive layer, intergate dielectric film, and a control conductive layer, which is to become the CG, are formed on the lower conductive layer; and when these layers and film are subjected to partial etching to divide into a plurality of sections in the direction in which the source regions and drain regions extend, none of intergate dielectric film is left behind by etching.

In a preferable embodiment of the method of fabricating a semiconductor device of the present invention, a base conductive layer is formed over the entire surface of the gate dielectric film after forming the gate dielectric film, and the lower conductive layer and mounds are formed by patterning this base conductive layer. The lower conductive layer and mounds are thus simultaneously formed of the same material.

Further, in a preferable embodiment of the method of fabricating a semiconductor device of the present invention, the step of forming an interlayer dielectric film includes steps of: forming a lower interlayer dielectric film on the surface of the semiconductor substrate to cover the gate dielectric film, mounds, and lower conductive layer; etching the areas of the lower interlayer dielectric film that are between mounds to expose at least the upper surface of the lower conductive layer; forming an upper interlayer dielectric film on the surface of the semiconductor substrate, thereby covering the exposed lower conductive layer and interlayer dielectric film; and etching back the upper and lower interlayer dielectric films to expose the upper surface of the lower conductive layer.

In this case, the film thickness of the interlayer dielectric film that is removed by etching of the upper and lower interlayer dielectric film in the step of exposing the upper surface of the lower conductive layer is preferably set according to the width of etching between the mounds in the step of etching the areas of the lower interlayer dielectric film that are between mounds to expose at least the upper surface of the lower conductive layer. The relation between the etching width and the film thickness of the removed interlayer dielectric film is thus set as appropriate, and the interlayer dielectric film can be formed such that the surface of the interlayer dielectric film is not substantially perpendicular to the surface of the semiconductor substrate at both sides of the lower conductive layer despite exposing the upper surface of the lower conductive layer.

In an actual case, the interlayer dielectric film is formed so as to satisfy the relations:

$$a \geq b+2c+d$$

$$a \leq e-d$$

where a is the etching width, b is the width of the upper surface of the lower conductive layer, c is the thickness of the interlayer dielectric film that is removed by etchback in the step of exposing the upper surface of the lower conductive layer, d is the maximum positional error in the direction of width of the lower conductive layer when etching the areas between mounds, and e is the spacing between adjacent mounds.

In a preferable embodiment of the method of fabricating a semiconductor device of the present invention, in the step of forming the lower conductive layer, the step of forming the upper conductive layer, and the step of forming the interlayer dielectric film, the thickness of the lower conductive layer, the thickness of the upper conductive layer, and the thickness of the interlayer dielectric film are set such that damage does not occur to the mounds when partially etching the control conductive layer, the intergate dielectric film, the upper conductive layer, and the lower conductive layer in the step of forming the plurality of transistor elements.

Finally, in the description in this specification, expressions such as "left", "right", "horizontal direction" and "direction of depth" are used with the figures as a reference for the sake of convenience to describe, for example, the direction of arrangement of each of the constituent elements on the semiconductor substrate. However, these expressions do not represent absolute directions of an actual device at the time of fabrication or at the time of use of the device. Particularly, the directions "horizontal" and "depth" represent directions that are mutually orthogonal within a plane that is parallel to the surface of the substrate, which is the main structure of the semiconductor device of the present invention. Further, the directions "up", "down", and "vertical" similarly represent directions that are perpendicular to the surface of the substrate, and do not indicate absolute directions of the actual device at the time of fabrication or at the time of use of the device.

The above and other objects, features, and advantages of the present invention will become apparent from the following description with reference to the accompanying drawings which illustrate examples of the present invention.

DETAILED DESCRIPTION OF THE PREFERRED EMBODIMENT

Figure 1A:
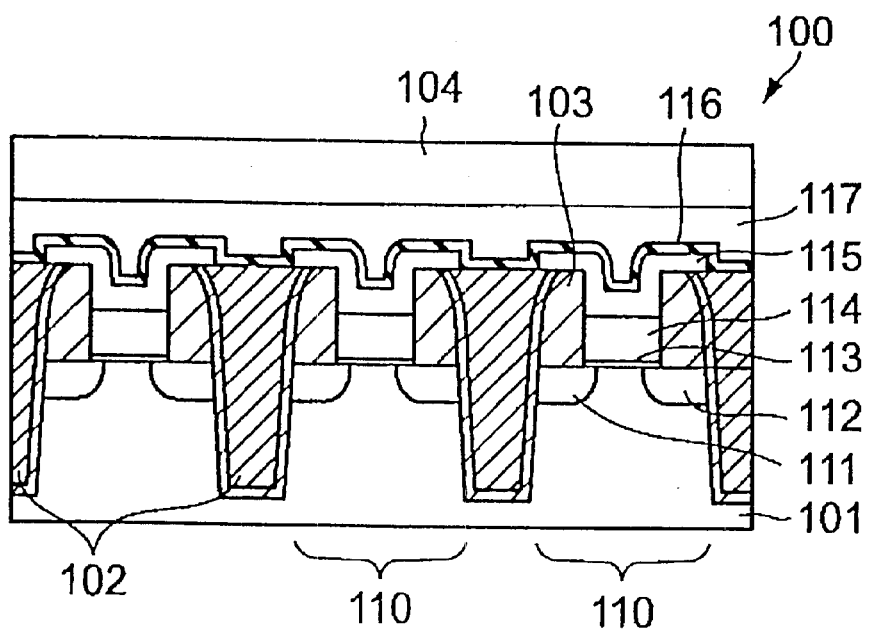
FIG. 1a is a vertical section of a nonvolatile memory of the prior art cut at the position of a transistor element.
Figure 1B:
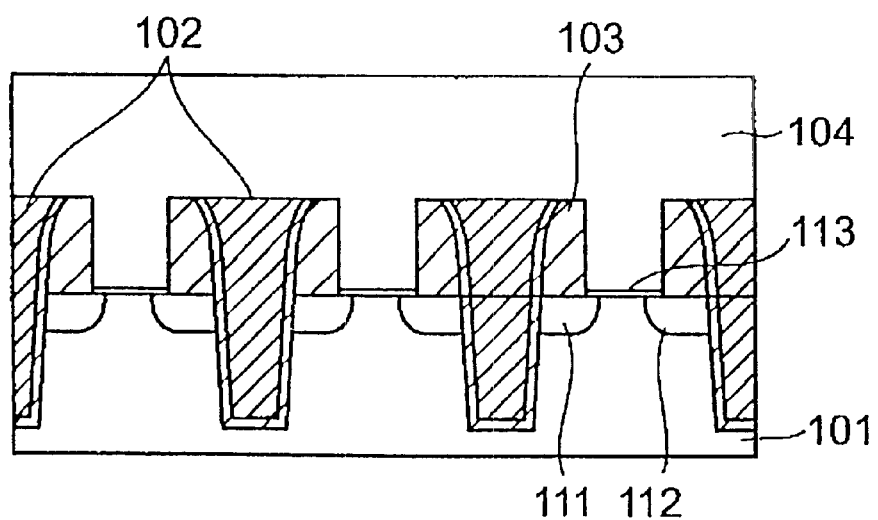
FIG. 1b is a vertical section of a nonvolatile memory shown in FIG. 1a cut at the position between transistor elements.
Figure 2A:
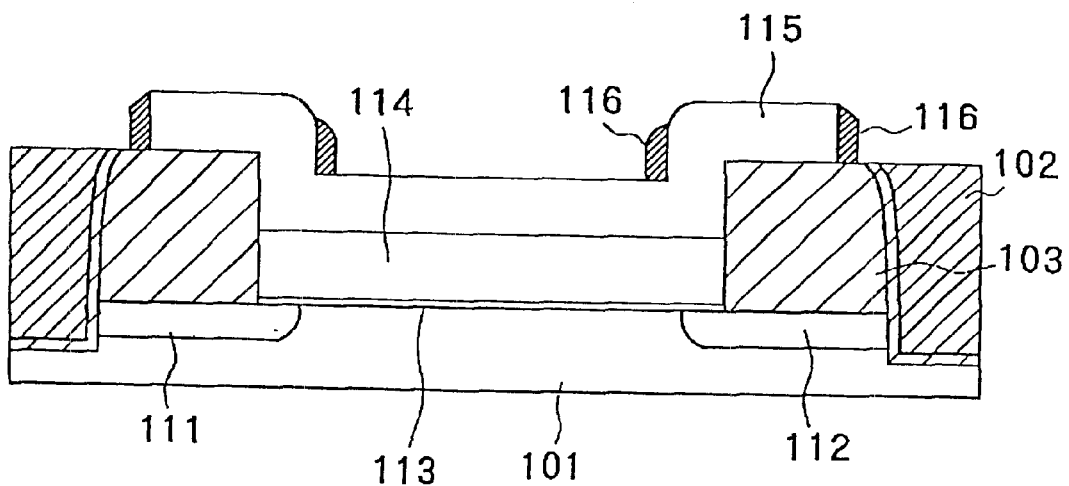
FIG. 2a and FIG. 2b are vertical sections for explaining problems that occur in the nonvolatile memory of the prior art.
Figure 2B:
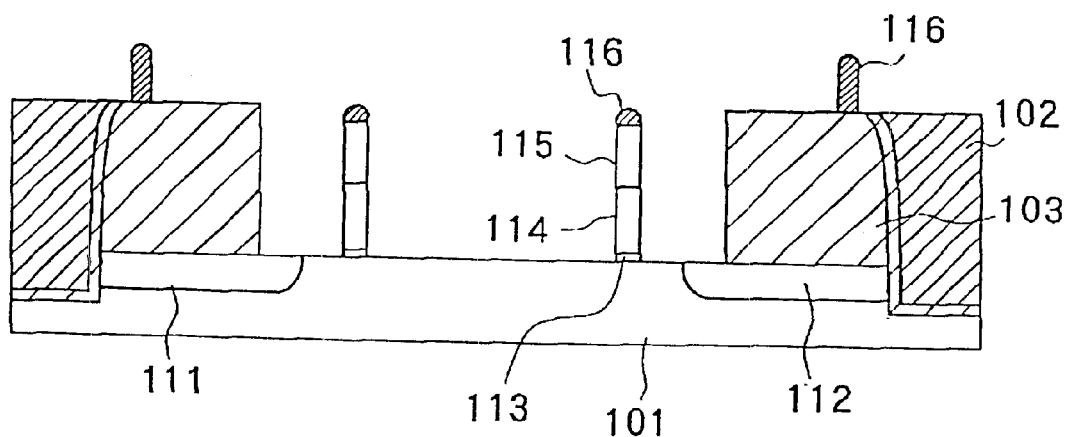
Figure 3:
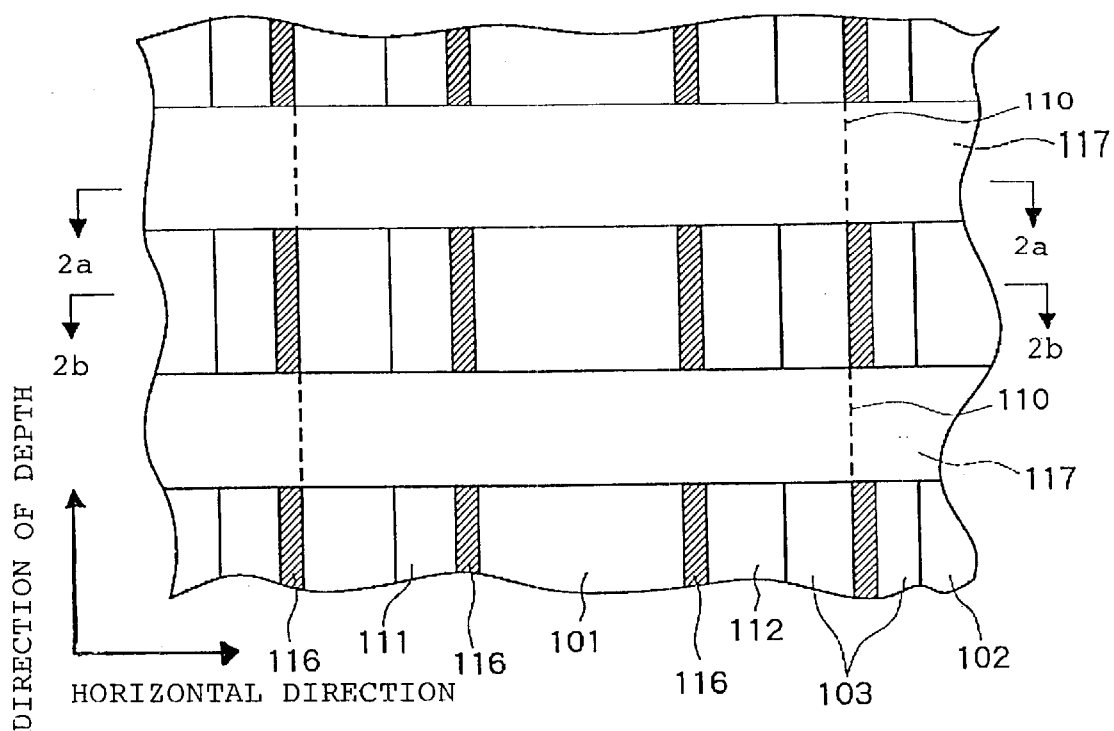
FIG. 3 is a plan view for explaining problems that occur in the nonvolatile memory of the prior art.
Figure 4A:
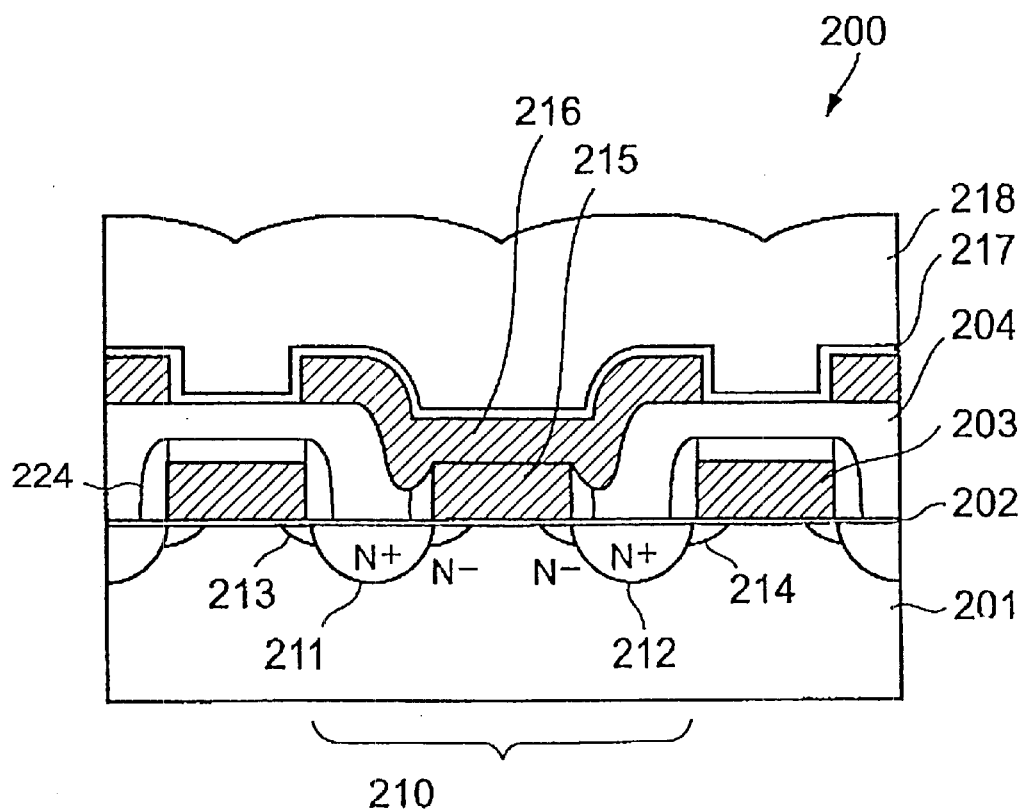
FIG. 4a is a vertical section of a nonvolatile memory that is one embodiment of the present invention cut at the position of a transistor element.
Figure 4B:
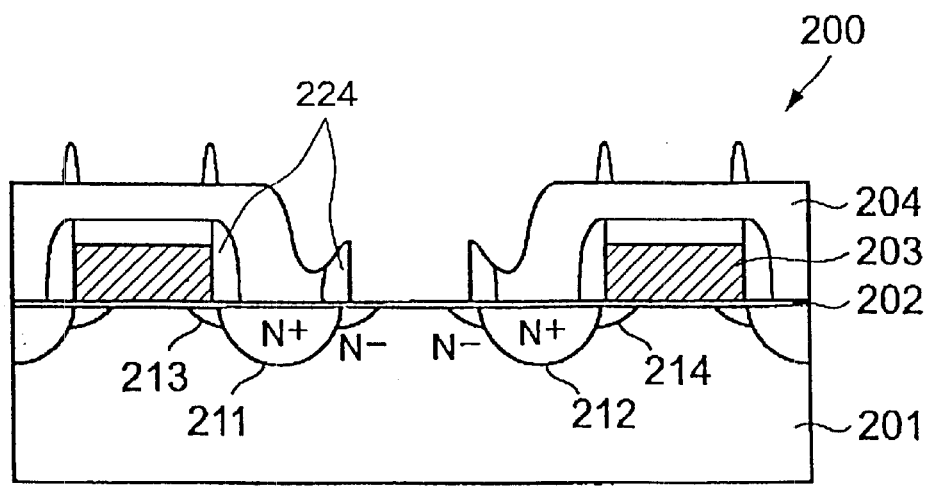
FIG. 4b is a vertical section of the nonvolatile memory shown in FIG. 4a cut at the position between transistor elements.
Figure 5:
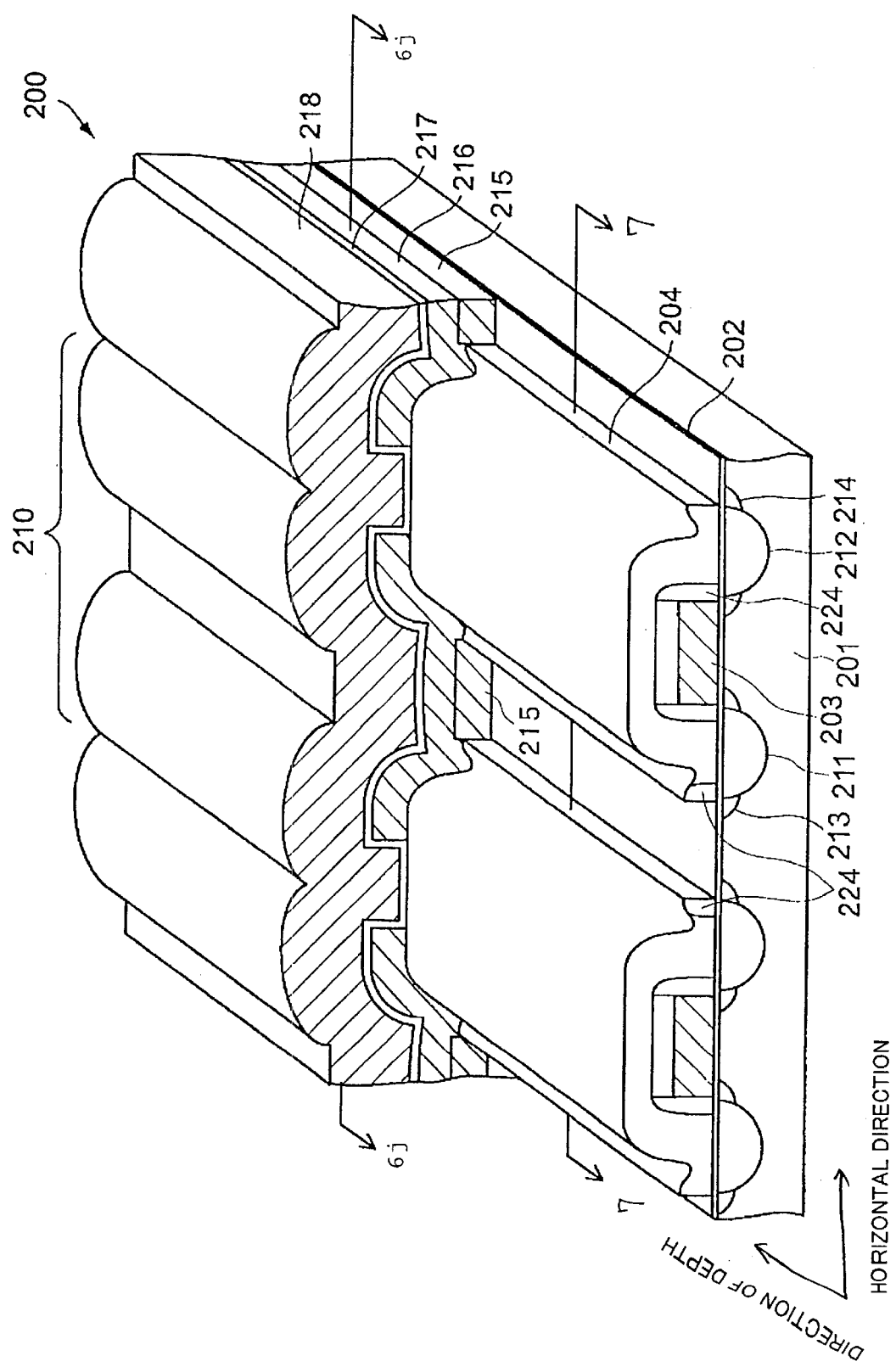
FIG. 5 is a perspective view of a nonvolatile memory that is one embodiment of the present invention.

Referring now turn to FIGS. 4a 4b, and 5, there is shown nonvolatile memory 200, which is a semiconductor device according to an embodiment of the present invention. Nonvolatile memory 200 is a device in which a multiplicity of transistor elements 210 are arranged as memory cells in matrix form on the upper surface of semiconductor substrate 201.

Source regions 211 and drain regions 212 are formed below the surface of semiconductor substrate 201 in the direction of depth of the figure from N+ regions in which an n-type impurity such as arsenic or phosphorus is deeply doped. N– (minus) regions 213 and 214, in which an n-type impurity is lightly doped, are formed below the surface of semiconductor substrate 201 on both sides of source regions 211 and drain regions 212, respectively.

Gate dielectric film 202 is formed on the surface of semiconductor substrate 201. A plurality of lower FG 215 composed of polysilicon are formed on gate dielectric film 202 in the direction of depth in the areas between source regions 211 and drain regions 212. Source regions 211 and drain regions 212 are shared by transistor elements 210 that neighbor each other in the direction of depth, but lower FG 215 are divided into sections, one section being provided for each of the transistor elements 210 that are arranged in the direction of depth.

Element isolation electrodes 203 are formed in the shape of mounds in the direction of depth on the right and left sides of each of lower FG 215 on the upper surface of gate dielectric film 202. Adjacent transistor elements 210 on the left and right are electrically isolated by element isolation electrodes 203.

To state in greater detail, element isolation electrodes 203 are grown from, for example, the same polysilicon as lower FG 215 on the surface of gate dielectric film 202 between drain regions 212 and source regions 211 of transistor elements 210 that are adjacent horizontally, and are grounded together with semiconductor substrate 201.

Oxide insulation film 204 is formed on both the left and right of lower FG 215 as an interlayer dielectric film that covers element isolation electrode 203. Upper FG 216 are formed on the surface of each of lower FG 215. Upper FG 216 are formed to spread to the left and right on the surface of lower FG 215 so as to cover a portion of oxide insulation film 204, and the surface area of this film is therefore greater than that of lower FG 215.

ONO film 217 is formed from a pattern that is divided in the direction of depth as an intergate dielectric film on the surfaces of upper FG 216 and oxide insulation film 204. CG 218 are formed on each of the surfaces of ONO film 217 from a pattern that is divided in the direction of depth in the same way as ONO film 217. In nonvolatile memory 200 of this embodiment as well, CG 218 function as word lines, and drain regions 212 function as bit lines.

Nonvolatile memory 200 of this embodiment is formed by the above-described laminated structure, and while oxide insulation film 204 is formed from both sides of lower FG 215 to cover element isolation electrode 203, it is formed in a shape free of any steep portions having surfaces that are substantially parallel to the vertical direction.

As a result, upper FG 216, which are formed on the surfaces of lower FG 215 and oxide insulation film 204, are also formed such that their surfaces are free of steep portions that are substantially parallel to the vertical direction. Furthermore, ONO film 217, which is formed on the surfaces of this upper FG 216 and oxide insulation film 204, is also formed in a shape such that its surfaces above upper FG 216 are free of any steep portions that are substantially parallel to the vertical direction.

An example of the method of fabricating nonvolatile memory 200 of the form of this embodiment is described.

First, gate dielectric film 202 composed of a silicon thermal oxide film 9.0 nm thick, a conductive layer composed of a polysilicon layer 100 nm thick (not shown in the figure), and oxide film 221 (See FIG. 6a) that is deposited by a CVD (Chemical Vapor Deposition) method to a thickness of 100 nm are successively grown in that order on the surface of p-type semiconductor substrate 201.

Figure 6A:
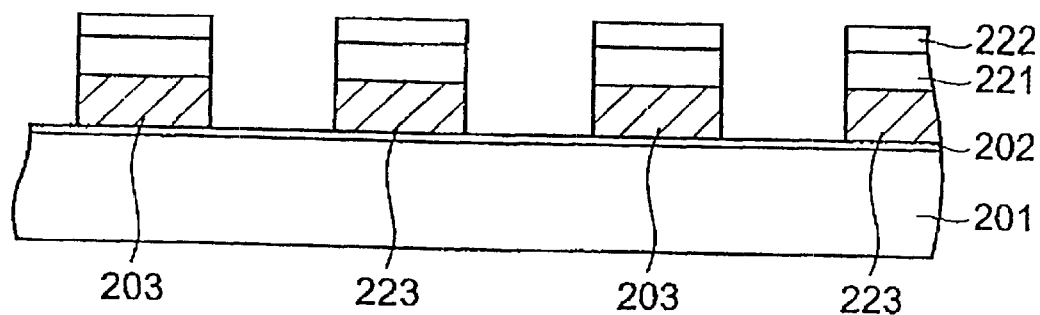
FIGS. 6a–6j are sections cut at the plane corresponding to that of FIG. 4a for explaining the fabrication steps of the nonvolatile memory shown in FIG. 5.

Next, above-described oxide film 221 and polysilicon layer are patterned by means of photolithography and plasma etching using mask 222 into a plurality of strips that extend in the direction of depth as shown in FIG. 6a, and a plurality of lower conductive layers 223 having a width of 220 nm and a plurality of element isolation electrodes 203 having a width of 220 nm are simultaneously formed at a spacing of 220 nm.

Figure 6B:
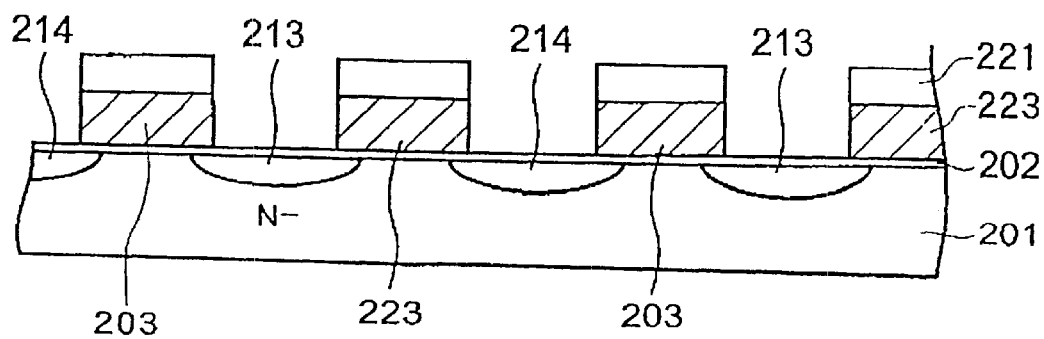

The exposed side surfaces of each of lower conductive layers 223 and element isolation electrodes 203 next undergo thermal oxidation to form a side oxide film (not shown in the figure) having a thickness of 11 nm, following which an n-type impurity such as arsenic or phosphorus is lightly doped in semiconductor substrate 201 from between lower conductive layers 223 and element isolation electrodes 203 as shown in FIG. 6b to form N–regions 213 and 214 below the surface of semiconductor substrate 201.

Figure 6C:
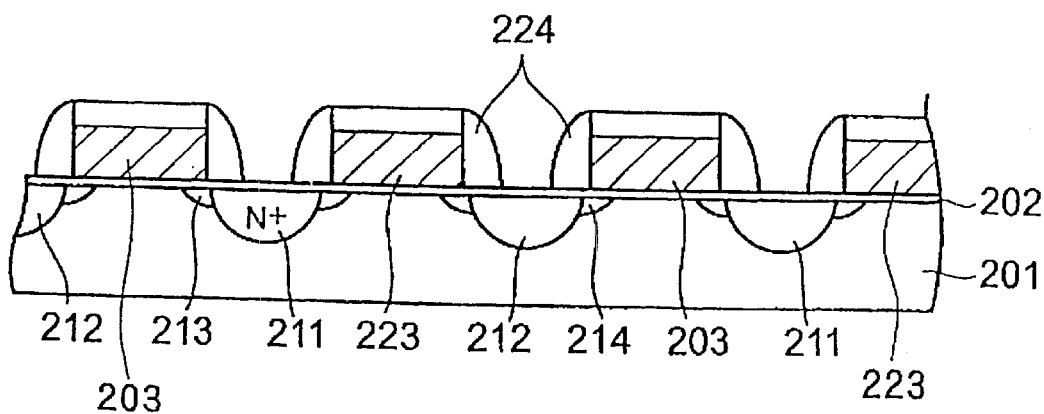

A silicon oxide film is then formed uniformly on the surface of semiconductor substrate 201 to a thickness of 70 nm by a CVD method including HTO. Then, as shown in FIG. 6c, this silicon oxide film is etched back to form oxide film spacers 224 on the left and right sides of each of lower conductive layer 223 and element isolation electrode 203. An n-type impurity is deeply doped in semiconductor substrate 201 from between oxide film spacers 224, whereby N+source regions 211 and N+ drain regions 212 having a width of 220 nm and extending in the direction of depth of the figure are formed below the surface of semiconductor substrate 201.

Figure 6D:
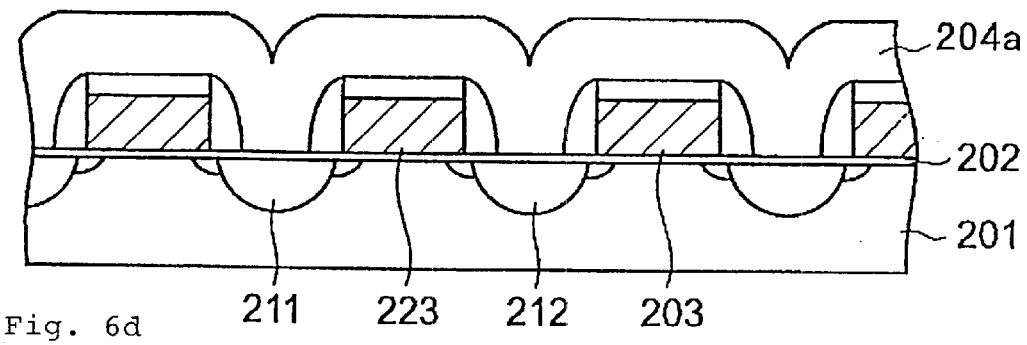
Figure 6E:
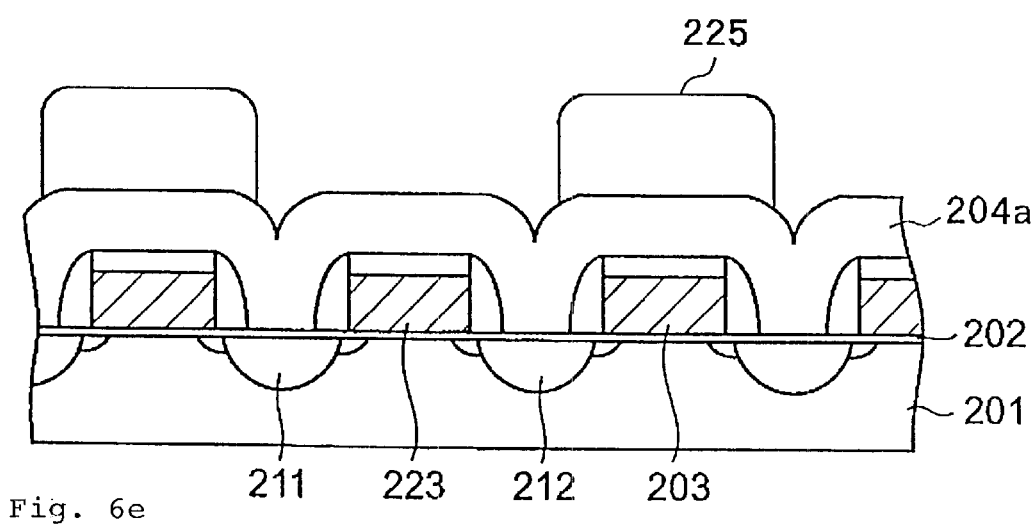

As shown in FIG. 6d, oxide insulation film 204a is formed on the surface of semiconductor substrate 201 by a CVD method that includes HTO to cover the entire construction that has been formed thus far to a thickness of 100 nm. A plurality of resist masks 225 are next formed on portions of the surface of this oxide insulation film 204a, as shown in FIG. 6e. Each of resist masks 225 are formed above each of element isolation electrodes 203 in the direction of depth, the spacing a between the resist masks 225 being 460 nm.

Figure 6F:
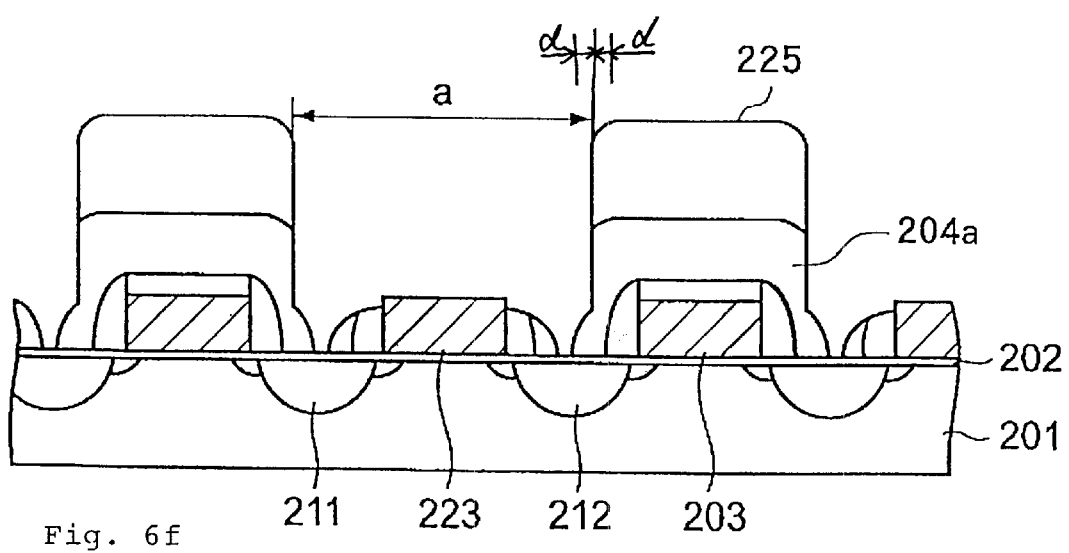
Figure 6G:
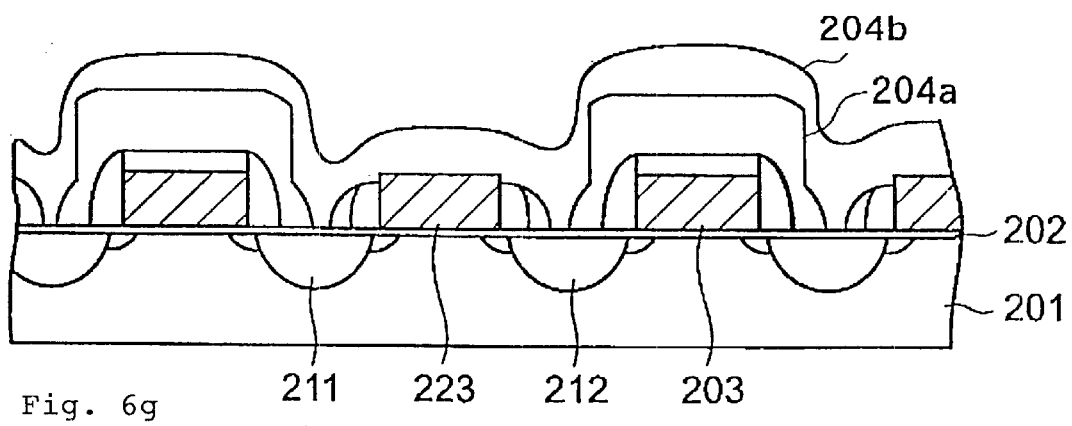

As shown in FIG. 6f, oxide insulation film 204a is subjected to partial plasma etching from above using resist masks 225 until the upper surfaces of lower conductive layers 223 are exposed. Resist masks 225 are removed upon completion of this etching. As shown in FIG. 6g, an additional oxide insulation film 204b is formed by a CVD method to a film thickness of 70 nm over the entire surface of semiconductor substrate 201 after completion of the etching and removal of the resist masks, and the entire surface of these oxide insulation films 204a and 204b is etched back to form a prescribed shape.

Figure 6H:
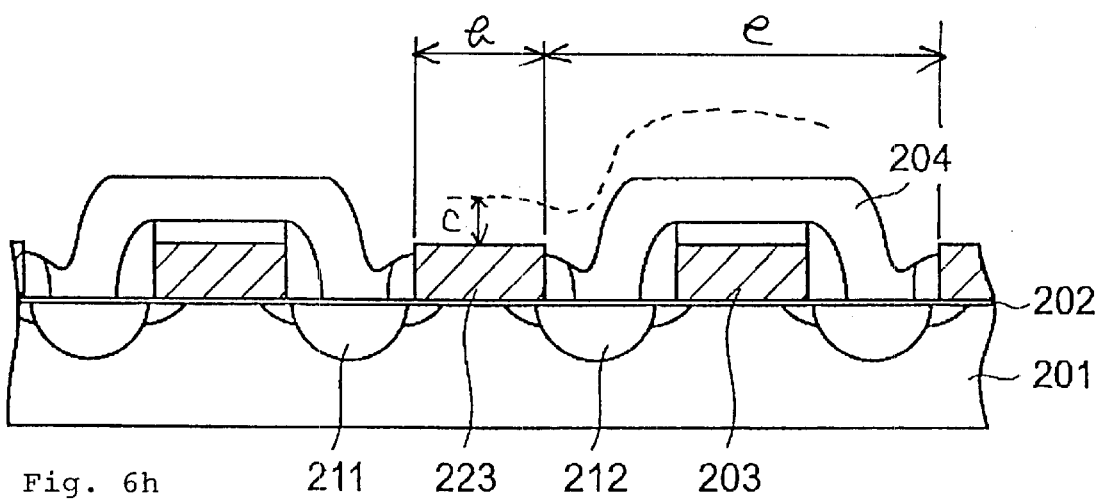

At this time, oxide insulation films 204 in the present embodiment can be etched back to expose the top surface of lower conductive layer 223 while producing a shape free of steep portions in the surface as shown in FIG. 6h by appropriately setting the aperture width of oxide insulation film 204a when the top surface of lower conductive layer 223 is exposed (i.e., the spacing a of resist masks 225) and the film thickness of additional oxide insulation film 204b.

To explain more specifically, the following equations are satisfied:

$$a \geq b+2c+d$$

$$a \leq e-d$$

where a is the aperture width of etching (refer to FIG. 6f), b is the width in the horizontal direction of the top surface of lower conductive layer 223 (refer to FIG. 6h), c is the thickness of oxide insulation film 204 that is to be removed by etchback (refer to FIG. 6h), d is the maximum positioning error in the horizontal direction during etching, and e is the spacing of adjacent element isolation electrodes 203 (refer to FIG. 6h).

If the maximum positional error d in the horizontal direction at the time of etching is 60 nm, since the width b of lower conductive layer 223 is 220 nm and the spacing e of adjacent element isolation electrodes 203 is 680 nm in the present embodiment, the thickness c of oxide insulation film 204 that is to be removed is 30–100 nm, and the lower limit of the corresponding aperture width a of etching is 340–480 nm and the upper limit is 620 nm.

Figure 6I:
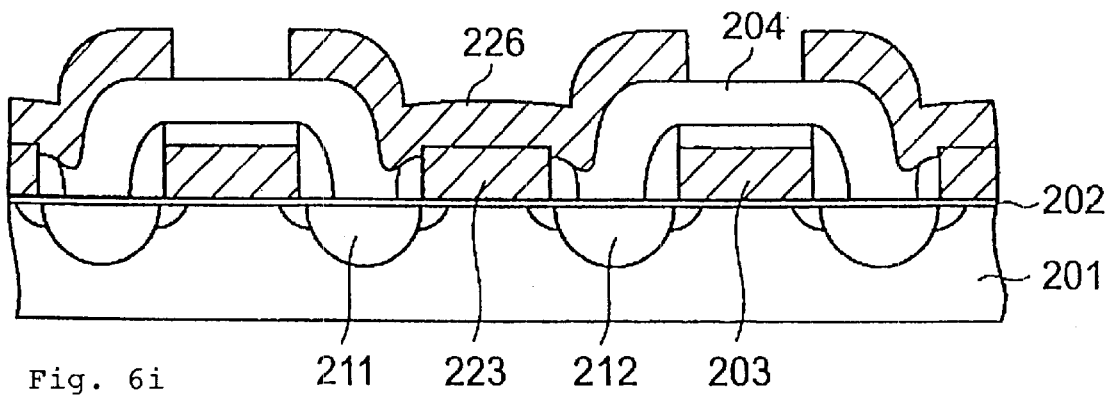

When etching of oxide insulation films 204 has been completed as described hereinabove, upper conductive layer 226 is formed on lower conductive layer 223 to a film thickness of 80 nm so as to both extend in the direction of depth and spread toward the left and right to cover a portion of oxide insulation films 204 as shown in FIG. 6i.

Figure 6J:
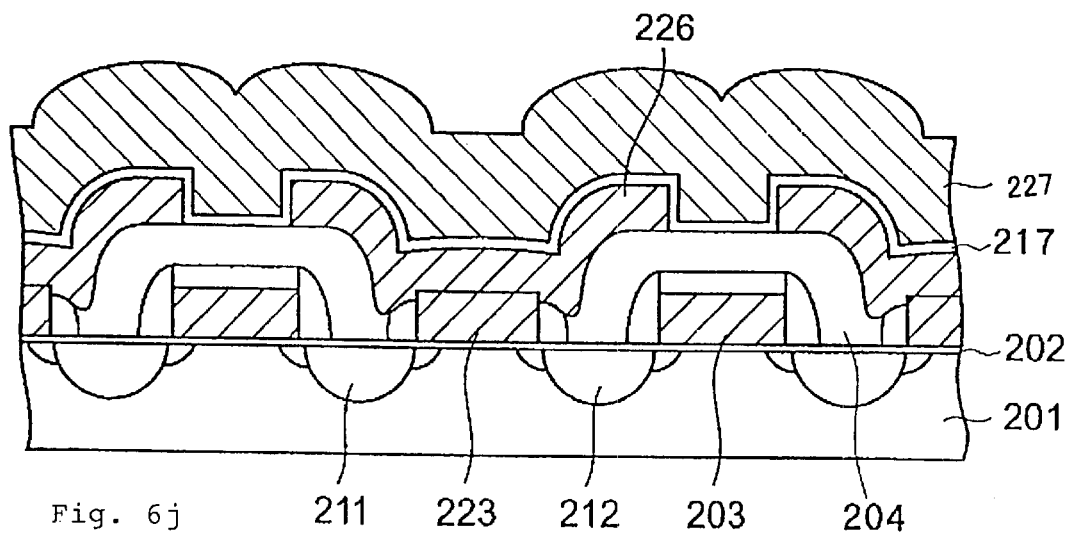

As shown in FIG. 6j, ONO film 217 having a film thickness of 12.5 nm and covering upper conductive layers 226 and oxide insulation films 204 that are exposed from between upper conductive layer 226, and control conductive layer 227 composed of tungsten silicide and having a film thickness of 200 nm, are formed in that order. Control conductive layer 227, ONO film 217, upper conductive layer 226, and lower conductive layer 223 are then divided in the direction of depth in the areas between transistor elements 210 in the direction of depth by etching from above using a resist mask to obtain the construction shown in FIG. 7.

CG 218 that extend horizontally as shown in FIG. 4a are formed by dividing control conductive layer 227 in the direction of depth. In addition, upper FG 216 and lower FG 215 as shown in FIG. 4a are formed by dividing upper conductive layer 226 and lower conductive layer 223 in the direction of depth. This completes nonvolatile memory 200, in which a multiplicity of transistor elements 210 are arranged in matrix form in the horizontal direction and in the direction of depth.

In the method of fabricating nonvolatile memory 200 of this embodiment, appropriately setting the film thickness of oxide insulation film 204, upper conductive layer 226, and lower conductive layer 223 prevents damage to element isolation electrodes 203 when etching to divide control conductive layer 227, ONO film 217, upper conductive layer 226, and lower conductive layer 223 in the direction of depth as described hereinabove.

As with the nonvolatile memory of the prior art, nonvolatile memory 200 of the present embodiment in the configuration as described hereinabove enables individual storage of data to each of a multiplicity of transistor elements 210 and erasing of stored data for prescribed units of a plurality of transistor elements 210 by injecting electrons to and extracting electrons from FG 215 and 216 through the application of a prescribed voltages to CG 218, source region 211, and drain region 212.

Nonvolatile memory 200 of the present embodiment is used in, for example, portable electronic devices. The power supply voltage of portable electronic devices in recent years is being decreased to the level of about 2 V. However, since a high voltage of approximately 20 V is necessary for writing data and erasing data in nonvolatile memory 200, current nonvolatile memory incorporates step-up circuits to obtain higher voltage. Not only must a multiplicity of stages of step-up circuits be formed to boost voltage ten-fold in this way, but power consumption also increases.

In nonvolatile memory 200 of this embodiment, however, upper FG 216 that confront CG 218 of transistor elements 210 are formed to spread horizontally and cover a portion of oxide insulation film 204, whereby the surface area of upper FG 216 is greater than that of lower FG 215. As a result, the capacitance between CG 218 and upper FG 216 is increased, and the voltage that is applied to CG 218 to control electrons of the FG is decreased.

In contrast to the nonvolatile memory of the prior art, element isolation electrodes 203, drain regions 212, and source regions 211 in nonvolatile memory 200 of this embodiment together constitute element isolation transistors, and element isolation electrodes 203 and semiconductor substrate 201 are further grounded. As a result, the element isolation transistors are always kept in an OFF state, and horizontally adjacent transistor elements 210 can be reliably isolated.

Furthermore, the element isolation electrodes 203 of these element isolation transistors confront CG 218 across oxide insulation film 204 and ONO film 217, but since oxide insulation film 204 is formed with a sufficient film thickness as described in the foregoing explanation, current does not leak from CG 218 to element isolation electrodes 203, and insulation breakdown therefore does not occur.

If 20 V is applied to CG 218, for example, the difference in potential between CG 218 and upper FG 216 is divided between the capacitance between CG 218 and upper FG 216 and the capacitance between lower FG 215 and semiconductor substrate 201, and therefore is reduced by half to approximately 10 V. The difference in potential between CG 218 and element isolation electrode 203, however, is 20 V because element isolation electrode 203 is locked to ground.

Since the capacitance between CG 218 and upper FG 216 must be high, ONO film 217 located between CG 218 and upper FG 216 is preferably as thin as possible. However, the insulating layer that is positioned between CG 218 and element isolation electrode 203 is preferably thick enough to prevent insulation breakdown.

Above-described element isolation electrodes 203 are formed at the same time as lower FG 215 of transistor element 210 and from the same conductive layer, and nonvolatile memory 200 of this embodiment therefore has good productivity. Nevertheless, the isolation of transistor elements 210 by means of element isolation electrodes 203 does not require as much width in the horizontal direction as element isolation by, for example, LOCOS (Local Oxidation of Silicon) of the prior art, and nonvolatile memory 200 of this embodiment therefore enables higher integration.

Further, since lower FG 215 and element isolation electrodes 203 can be formed in the same process using the same mask, the formation of these constituent elements can be simplified and productivity can be improved, and source region 211 and drain region 212 can be formed with greater uniformity of width than in element isolation by, for example, LOCOS.

In order to provide effective element isolation with a simple configuration of transistor elements 210 that are highly integrated in this way, mounds composed of element isolation electrodes 203 are positioned at both sides of lower FG 215, with the result that upper FG 216, which expand to the right and left, are displaced upward at the right and left ends to form a concave shape.

In nonvolatile memory 200 of this embodiment, however, the absence of any steep portions that are substantially parallel to the vertical direction on the surface of oxide insulation film 204 located on the left and right sides of lower FG 215 means that there are also no steep portions on the portions of upper FG 216 that are formed on the surface of oxide insulation film 204 or on the portions of ONO film 217 that are formed on the surface of upper FG 216.

In nonvolatile memory 200 of this embodiment, therefore, when control conductive layer 227, ONO film 217, upper conductive layer 226, and lower conductive layer 223 are each subjected to partial etching from above to divide in the direction of depth and thus form the plurality of transistor elements 210 that are arranged in the direction of depth, portions of these layers are not left behind, thereby preventing the occurrence of problems such as the short-circuiting between transistor elements 210 that are adjacent in the direction of depth.

Furthermore, although steep portions that extend in a substantially vertical direction are present in ONO film 217 at positions at the left and right ends of upper conductive layer 226, the vertical thickness of these portions corresponds to the film thickness of upper conductive layer 226 and therefore are not excessive, and these portions can be sufficiently removed in normal plasma etching.

Figure 7:
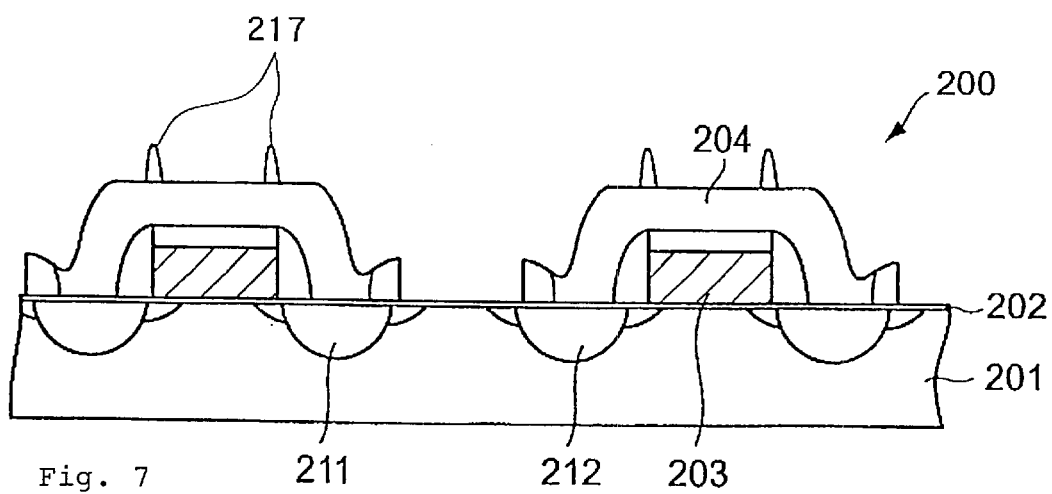
FIG. 7 is a section cut at a plane corresponding to that of FIG. 4b in the step shown in FIG. 6j.

Still further, since FG 216 and 215 are not present below these positions, a remnant of ONO film 217 at these positions as shown in FIG. 4b and FIG. 7 will not cause problems. The inclination of ONO film 217 should be of a degree that allows removal of a prescribed film thickness of ONO film 217 during the time interval of normal plasma etching. The "time interval of normal plasma etching" referred to here is a time interval in which, for example, the upper conductive layer will not be damaged despite overetching.

In order to form the surface of oxide insulation film 204 in a shape that is free of steep portions that are substantially parallel to the vertical direction in nonvolatile memory 200 of the present embodiment as described in the foregoing explanation, underlying oxide insulation film 204a is etched until lower conductive layer 223 is exposed, and after adding oxide insulation film 204b uniformly over the entire surface, etching is performed again.

As a result, if the aperture width of this etching and the film thickness of oxide insulation film 204 that is etched back are not appropriate, oxide insulation film 204 may remain on the upper surface of lower conductive layer 223 or steep portions may remain on the surface of oxide insulation film 204.

In the method of fabricating nonvolatile memory 200 of this embodiment, however, the etching aperture width a, the width b of the upper surface of lower conductive layer 223, the thickness c of oxide insulation film 204 that is removed, the maximum positional error d of etching in the horizontal direction, and the spacing e of adjacent element isolation electrodes 203 are all in a relation that satisfies the two above-described equations.

As a result, element isolation electrodes 203 will not suffer damage despite variation up to the maximum positional error of etching in the horizontal direction. Furthermore, since oxide insulation film 204 that has been etched back is not located on the upper surface of lower conductive layer 223, no portion of lower conductive layer 223 will remain below oxide insulation film 204 when control conductive layer 227, ONO film 217, upper conductive layer 226, and lower conductive layer 223 are subjected to partial etching from above to divide in the direction of depth, thereby preventing the problem of short-circuiting of transistor elements 210 that are adjacent in the direction of depth.

In the method of fabricating nonvolatile memory 200 of this embodiment, moreover, the film thicknesses of oxide insulation film 204, upper conductive layer 226, and lower conductive layer 223 are set appropriately, with the result that no damage will occur to element isolation electrodes 203 when etching is carried out to divide control conductive layer 227, ONO film 217, upper conductive layer 226, and lower conductive layer 223 in the direction of depth.

The present invention is not limited by the above-described embodiment and allows various modifications that do not depart from the scope of the invention. For example, although specific examples of the materials and dimensions of various layers and films were described in the above-described embodiment, these can of course be variously modified in accordance with required performance or design specifications.

For example, an example was described in which the film thickness of gate dielectric film 202 was 9.0 nm, but this thickness may vary over the range 4–11 nm. Similarly, the thickness of lower conductive kayer 223 and element isolation electrodes 203 may vary over the range 50–200 nm, the thickness of oxide film 221 may vary over the range 50–200 nm, the thickness of side surface oxide films may vary over the range 4–11 nm, the thickness of oxide film spacer 224 may vary over the range 30–150 nm, the thickness of oxide insulation film 204 may vary over the range 50–200 nm, the thickness of oxide insulation film 204 that is etched back may vary over the range 30–100 nm, the thickness of upper FG 216 may vary over the range 50–150 nm, the thickness of ONO film 217 may vary over the range 12–20 nm, and the thickness of control conductive layer 227 may vary over the range 100–200 nm.

In addition, although an example was described in the above-described embodiment in which element isolation transistors were formed as n-type and lower FG 215 were grounded, element isolation transistors may be formed as p-type and lower FG 215 may be connected to the power supply potential. Further, the potential of this lower FG 215 need not be the ground voltage or the power supply voltage, but may be a voltage that can turn OFF the flow of electricity between adjacent source and drain regions 211 and 212.

While a certain preferred embodiment of the present invention has been shown and described in detail, it should be understood that various changes and modifications may be made without departing from the spirit or scope of the appended claims.

What is claimed is:

1. A semiconductor device comprising:
    a semiconductor substrate;
    source regions that are formed below the surface of said semiconductor substrate and extending in one direction along the surface of said semiconductor substrate;
    drain regions that are formed below the surface of said semiconductor substrate and extending parallel to said source regions;
    a gate dielectric film formed on the surface of said semiconductor substrate;
    a plurality of lower FG (Floating Gates) that are arranged on the surface of said gate dielectric film in the areas between said source regions and said drain regions and in the direction in which said source regions and said drain regions extend;
    mounds formed on the surface of said gate dielectric film on both sides of said lower FG and extending in the direction in which said source regions and said drain regions extend;
    interlayer dielectric films formed on both sides of said lower FG and covering said mounds;
    a plurality of upper FG formed on each of the surfaces of said plurality of lower FG, spreading toward the regions in which said mounds are formed, and covering a portion of said interlayer dielectric films;
    a plurality of intergate dielectric films formed on each of the surfaces of said plurality of upper FG; and
    a plurality of CG (Control Gates) formed on each of the surfaces of said plurality of intergate dielectric films;
    wherein said intergate dielectric films are formed in a shape that does not rise in a direction that is substantially perpendicular to the surface of said semiconductor substrate at least above said upper FG.

2. A semiconductor device according to claim 1 wherein the surfaces of said upper FG are formed in a shape having no portions that are substantially perpendicular to the surface of said semiconductor substrate.

3. A semiconductor device according to claim 2 wherein the surfaces of said interlayer dielectric films are formed in a shape having no portions that are substantially perpendicular to the surface of said semiconductor substrate.

4. A semiconductor device according to claim 1 wherein a plurality of transistor elements are formed by said source regions, said drain regions, said lower FG, said upper FG, and said CG; these transistor elements being arranged in the direction in which said source regions and said drain regions extend.

5. A semiconductor device according to claim 4 wherein:
    a plurality of said transistor elements are also arranged on the surface of said semiconductor substrate in a direction that is perpendicular to the direction in which said source regions and said drain regions extend; and
    element isolation electrodes are formed as said mounds to isolate said transistor elements that are adjacent in a direction that is perpendicular to the direction in which said source regions and said drain regions extend.

6. A semiconductor device according to claim 5 wherein said element isolation electrodes are formed from the same material as said lower FG on the surface of said gate dielectric film in areas between said drain regions and said source regions of said transistor elements that are adjacent in a direction that is perpendicular to the direction in which said source regions and said drain regions extend.

7. A semiconductor device according to claim 6 wherein said element isolation electrodes and said semiconductor substrate are grounded.

8. A method of fabricating a semiconductor device comprising the steps of:
    forming a gate dielectric film on the surface of a semiconductor substrate;
    forming a lower conductive layer on a portion of the surface of said gate dielectric film that extends in one direction on the surface of said semiconductor substrate;
    forming mounds on a portion of the surface of said gate dielectric film, said mounds being spaced from said lower conductive layer, arranged on both sides of said lower conductive layer, and extending parallel to said lower conductive layer;
    forming source regions and drain regions below the surface of said semiconductor substrate using said mounds and said lower conductive layer as a mask, said source regions and said drain regions extending parallel to said mounds and said lower conductive layer;
    forming an interlayer dielectric film on the surface of said semiconductor substrate that covers said mounds in a shape that exposes the upper surface of said lower conductive layer, and moreover, in which the surface of said interlayer dielectric film is not substantially perpendicular to the surface of said semiconductor substrate at both sides of said lower conductive layer;
    forming an upper conductive layer on the exposed upper surface of said lower conductive layer that spreads to both sides of said lower conductive layer and covers a portion of said interlayer dielectric film;
    forming an intergate dielectric film on the surfaces of said upper conductive layer and said interlayer dielectric film;
    forming a control conductive layer on the surface of said intergate dielectric film; and
    forming a plurality of transistor elements that are arranged in the direction in which said source regions and said drain regions extend by subjecting said control conductive layer, said intergate dielectric film, said upper conductive layer, said lower conductive layer to partial etching to divide into a plurality of sections in the direction in which said source regions and said drain regions extend.

9. A method of fabricating a semiconductor device according to claim 8 wherein a base conductive layer is formed over the entire surface of said gate dielectric film after forming said gate dielectric film, and said lower conductive layer and said mounds are simultaneously formed by patterning this base conductive layer.

10. A method of fabricating a semiconductor device according to claim 8, wherein the step of forming said interlayer dielectric film comprises the steps of:
    forming a lower interlayer dielectric film on the surface of said semiconductor substrate to cover said gate dielectric film, said mounds, and said lower conductive layer;
    etching the areas on said lower interlayer dielectric film that are between said mounds to expose at least the upper surface of said lower conductive layer;

forming an upper interlayer dielectric film on the surface of said semiconductor substrate and covering said exposed lower conductive layer and said interlayer dielectric film; and etching back said upper and lower interlayer di electric films to expose the upper surface of said lower conductive layer.

11. A method of fabricating a semiconductor device according to claim 10 wherein the thickness of the interlayer dielectric film that is removed by etching back said upper and lower interlayer dielectric film in the step of exposing the upper surface of said lower conductive layer is set according to the width of etching between said mounds in the step of etching the areas on said lower interlayer dielectric film that are between said mounds to expose at least the upper surface of said lower conductive layer.

12. A method of fabricating a semiconductor device according to claim 11 wherein said interlayer dielectric film is formed so as to satisfy the relations:

$a \geq b+2c+d$ $a \leq e-d$ where a is said etching width, b is the width of the upper surface of said lower conductive layer, c is the thickness of said interlayer dielectric film that is removed by etchback in the step of exposing the upper surface of said lower conductive layer, d is the maximum positional error in the direction of width of said lower conductive layer, and e is the spacing of said adjacent mounds.

13. A method of fabricating a semiconductor device according to claim 8 wherein, in the step of forming said lower conductive layer, the step of forming said upper conductive layer, and the step of forming said interlayer dielectric film, the thickness of said lower conductive layer, the thickness of said upper conductive layer, and the thickness of said interlayer dielectric film are set such that damage does not occur to said mounds when partially etching said control conductive layer, said intergate dielectric film, said upper conductive layer, and said lower conductive layer in the step of forming said plurality of transistor elements.

* * * * *